(12) United States Patent
Tsai et al.

(10) Patent No.: US 9,972,498 B2
(45) Date of Patent: May 15, 2018

(54) METHOD OF FABRICATING A GATE CAP LAYER

(71) Applicant: UNITED MICROELECTRONICS CORP., Hsin-Chu (TW)

(72) Inventors: Fu-Shou Tsai, Keelung (TW); Yu-Ting Li, Chiayi (TW); Chih-Hsun Lin, Ping-Tung County (TW); Li-Chieh Hsu, Taichung (TW); Yi-Liang Liu, Tainan (TW); Po-Cheng Huang, Kaohsiung (TW); Kun-Ju Li, Tainan (TW); Wen-Chin Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 125 days.

(21) Appl. No.: 15/081,932

(22) Filed: Mar. 27, 2016

(65) Prior Publication Data
US 2017/0162396 A1 Jun. 8, 2017

Related U.S. Application Data

(63) Continuation-in-part of application No. 14/960,977, filed on Dec. 7, 2015.

(51) Int. Cl.
| | | |
|---|---|---|
| *B23P 15/00* | (2006.01) |
| *C03C 25/00* | (2018.01) |
| *C23F 1/00* | (2006.01) |
| *B44C 1/22* | (2006.01) |
| *C03C 15/00* | (2006.01) |
| *C03C 25/68* | (2006.01) |
| *H01L 21/28* | (2006.01) |
| *H01L 29/66* | (2006.01) |

(Continued)

(52) U.S. Cl.
CPC .... *H01L 21/28247* (2013.01); *H01L 21/0223* (2013.01); *H01L 21/02247* (2013.01); *H01L 21/31056* (2013.01); *H01L 29/66545* (2013.01)

(58) Field of Classification Search
CPC ......... H01L 21/31051; H01L 29/66545; H01L 21/0223
See application file for complete search history.

(56) References Cited

U.S. PATENT DOCUMENTS

| | | | |
|---|---|---|---|
| 8,367,534 B2 | 2/2013 | Chen | |
| 2008/0194091 A1* | 8/2008 | Lin | ............... H01L 21/28202 438/591 |

(Continued)

*Primary Examiner* — Thomas Pham
(74) *Attorney, Agent, or Firm* — Winston Hsu

(57) ABSTRACT

A method of fabricating a gate cap layer includes providing a substrate with an interlayer dielectric disposed thereon, wherein a recess is disposed in the interlayer dielectric and a metal gate fills in a lower portion of the recess. Later, a cap material layer is formed to cover the interlayer dielectric and fill in an upper portion of the recess. After that, a first sacrifice layer and a second sacrifice layer are formed in sequence to cover the cap material layer. The first sacrifice layer has a composition different from a composition of the cap material layer. The second sacrifice layer has a composition the same as the composition of the cap material layer. Next, a chemical mechanical polishing process is preformed to remove the second sacrifice layer, the first sacrifice layer and the cap material layer above a top surface of the interlayer dielectric.

13 Claims, 3 Drawing Sheets

(51) Int. Cl.
 *H01L 21/02* (2006.01)
 *H01L 21/3105* (2006.01)

(56) References Cited

U.S. PATENT DOCUMENTS

| | | | |
|---|---|---|---|
| 2014/0000686 A1* | 1/2014 | Mungekar | H01L 31/02167 136/252 |
| 2014/0070300 A1* | 3/2014 | Jang | H01L 27/11565 257/324 |
| 2014/0073099 A1* | 3/2014 | Park | H01L 29/42332 438/268 |
| 2014/0256124 A1 | 9/2014 | Hsu | |
| 2016/0118398 A1* | 4/2016 | Yon | H01L 27/11582 257/314 |

* cited by examiner

METHOD OF FABRICATING A GATE CAP LAYER

CROSS REFERENCE TO RELATED APPLICATIONS

This patent application is a continuation in part and claims priority to U.S. patent application Ser. No. 14/960,977, filed on Dec. 7, 2015, and entitled "METHOD OF MANUFACTURING A SEMICONDUCTOR STRUCTURE" the entire contents of which are incorporated herein by reference.

BACKGROUND OF THE INVENTION

1. Field of the Invention

The present invention relates to a method of fabricating a gate cap layer, and more particularly to a method of fabricating a gate cap layer by using a sacrifice layer having a variable composition.

2. Description of the Prior Art

Metal gate electrodes have evolved for improving the drive current by reducing polysilicon depletion. Replacement gate techniques have been developed to substitute metal gate electrodes for polysilicon gate electrodes. For example, a polysilicon gate is used during initial processing until a high temperature annealing process to activate source/drain region. Subsequently, the polysilicon gate is removed and replaced with a metal gate.

As transistor pitch scales down, self-aligned (SAC) contacts are essentially required to avoid gate to source/drain contact shorts, to reduce source/drain resistance by enabling an increase in the width of contact plugs, and to increase the lithography/etching process window. Formation of a cap layer on top of the replacement metal gate structure is a key process to prevent contact shorts between the contact plugs and the metal gates. However, a serious problem associated with this cap layer technique is that after forming the cap layer, dishing phenomenon occurs on the cap layer.

SUMMARY OF THE INVENTION

Therefore, a need therefore exists for methodology enabling formation of a cap layer without dishing phenomenon.

According to a preferred embodiment of the present invention, a method of fabricating a gate cap layer, includes providing a substrate with an interlayer dielectric disposed thereon, wherein a recess is disposed in the interlayer dielectric, a metal gate fills in a lower portion of the recess, and an upper portion of the recess is exposed. Later, a cap material layer is formed to cover the interlayer dielectric and fill in the upper portion of the recess. After that, a first sacrifice layer is formed to cover the cap material layer, wherein the first sacrifice layer has a composition different from a composition of the cap material layer. Subsequently, a second sacrifice layer is formed to cover the first sacrifice layer, wherein the second sacrifice layer has a composition the same as the composition of the cap material layer. Next, a chemical mechanical polishing process is preformed to remove the second sacrifice layer, the first sacrifice layer and the cap material layer above a top surface of the interlayer dielectric. Finally, after the chemical mechanical polishing process, the cap material layer remaining in the upper portion of the recess becomes a gate cap layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 depict a method of fabricating a gate cap layer according to a preferred embodiment of the present invention, wherein:

FIG. 1 is a schematic drawing shown a substrate with at least two metal gates disposed thereon;

FIG. 2 is a schematic drawing shown a stage of removing the metal gates partly;

FIG. 4 is a schematic drawing shown a stage of performing a chemical mechanical polishing process.

DETAILED DESCRIPTION

FIG. 1 to FIG. 4 depict a method of fabricating a gate cap layer according to a preferred embodiment.

Figure 1:
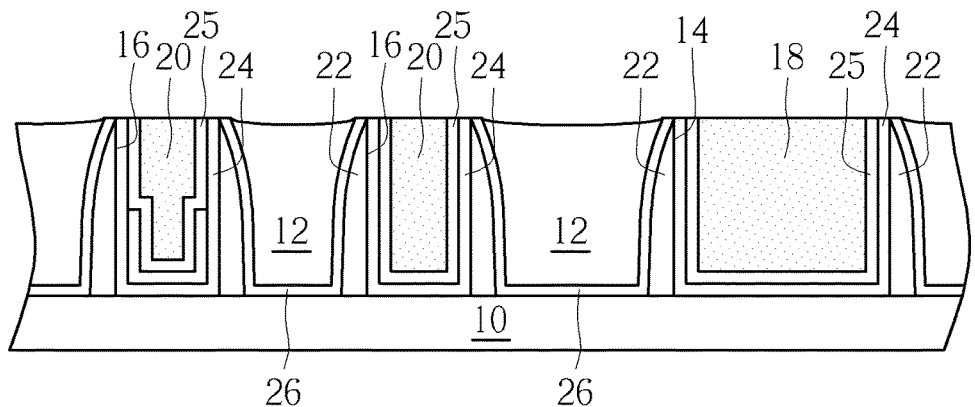

As shown in FIG. 1, a substrate 10 is provided. The substrate 10 can be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. The substrate 10 may optionally include fins (not shown) thereon. An interlayer dielectric 12 is disposed on and covers the substrate 10. Two recesses 14/16 are disposed in the interlayer dielectric 12. The recess 14 is wider than the recess 16. Two metal gates 18/20 are disposed within the recesses 14/16 respectively. The metal gate 18 is wider than the metal gate 20. A spacer 22 respectively surrounds the metal gate 18 and the metal gate 20. A high-k dielectric layer 24 is respectively disposed between the metal gate 18 and the substrate 10, and between the metal gate 20 and the substrate 10. A work function metal 25 is respectively disposed between the high-k dielectric layer 24 and the metal gate 18, and between the high-k dielectric layer 24 and the metal gate 20. Furthermore, although there is only one recess 14 and one recess 16 disposed within the interlayer dielectric 12, the number of the recess 14 and the recess 16 can be adjusted. As the number of the recess 14 or the recess 16 alters, the metal gate 18 or the metal gate 20 can be correspondingly disposed into the recess 14 or the recess 16. For example, another recess 16 is formed within the interlayer dielectric 12. Another metal gate 20 can be formed in another recess 16. Similarly, there are the work function metal 25 and the high-k dielectric layer 24 disposed in the recess 16.

An etching stop layer 26 conformally contacts the spacer 22 and substrate 10. The interlayer dielectric 12 may be silicon oxide. The metal gates 18/20 include tungsten or other metals. The top surface of the interlayer dielectric 12 may have dishing phenomenon.

Figure 2:
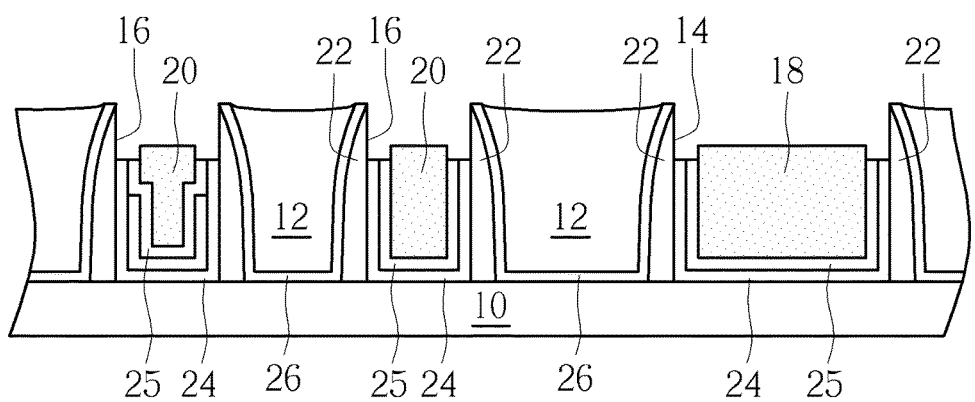
Figure 3A:
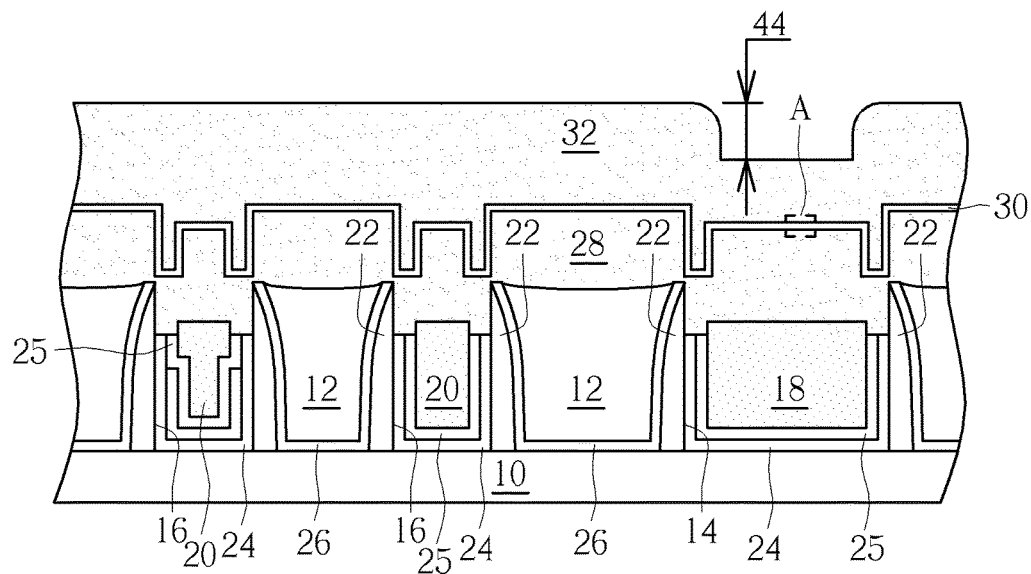
FIG. 3A is a schematic drawing shown a stage of forming a cap material layer, a first sacrifice layer and a second sacrifice layer.

As shown in FIG. 2, the metal gates 18/20 are removed partly to expose an upper portion of the recess 14 and an upper portion of the recess 16. The remaining metal gates 18/20 still fill lower portions of the recesses 14/16. As shown in FIG. 3A, a cap material layer 28 is formed to conformally cover the interlayer dielectric 12 and fill in the upper portions of the recesses 14/16. The cap material layer 28 is preferably silicon nitride. Later, a first sacrifice layer 30 is formed to conformally cover the cap material layer 28. The first sacrifice layer 30 does not fill into the recesses 14/16. The first sacrifice layer 30 has a composition different from a composition of the cap material layer 28. The first sacrifice layer 30 is preferably silicon oxynitride. After that, a second sacrifice layer 32 is formed to cover the first sacrifice layer 30. The second sacrifice layer 32 has a composition the same as the composition of the cap material layer 28. The second sacrifice layer 32 is also preferably silicon nitride. Furthermore, the thickness of the first sacrifice layer 30 is preferably about 10% of the total thickness of the cap material layer 28, the first sacrifice layer 30 and the second sacrifice layer 32. However, the percentage of the first sacrifice layer 30 can be adjusted based on different product requirements.

Figure 3B:
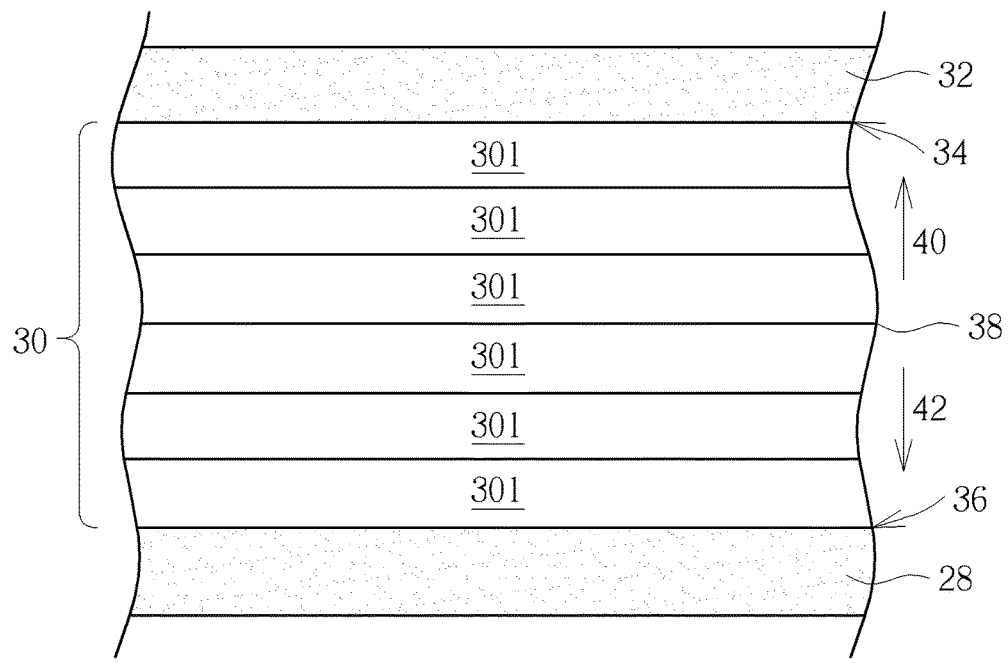
FIG. 3B is an enlarged view shown a region A of the second sacrifice layer, the first sacrifice layer and the cap material layer in FIG. 3A.

FIG. 3B is an enlarged view shown a region A of the second sacrifice layer 32, the first sacrifice layer 30 and the cap material layer 28 in FIG. 3A. Other positions of the first sacrifice layer 30 has the same structure as the structure of the first sacrifice layer 30 shown in the region A. As shown in FIG. 3B, it noteworthy that the first sacrifice layer 30 preferably includes numerous sub layers 301. The number of the sub layers 301 in the region A only serves as a sample, and the number of the sub layers 301 can be adjusted based on different product requirements.

The first sacrifice layer 30 has a top surface 34 contacting the second sacrifice layer 32 and has a bottom surface 36 contacting the cap material layer 28. Moreover, there is a middle surface 38 defined between the top surface 34 and the bottom surface 36 in the first sacrifice layer 30. The middle surface 38 may be a bottom surface or a top surface of one of the sub layers 301. Advantageously, the distance between the middle surface 38 and the top surface 34 equals to the distance between the middle surface 38 and the bottom surface 36. Furthermore, each of the sub layers 301 includes a first element and a second element, and the ratio of the second element to the first element in each of the sub layers 301 is variable with respective to the position of the sub layer 301. In detail, a ratio of the second element to the first element increases in a direction 40 from the middle surface 38 to the top surface 34, and increases in a direction 42 from the middle surface 38 to the lower surface 36.

For example, the first element is oxygen and the second element is nitrogen. The first sacrifice layer 30 is silicon oxynitride which has a chemical formula of $SiO_xN_y$, and wherein $0<X\leq 2$, $0\leq Y<4/3$. The cap material layer 28 and the second sacrifice layer 32 are both silicon nitride. Therefore, besides silicon, the first sacrifice layer 30 includes the first element, which is oxygen, the same as the interlayer dielectric 12. Besides silicon, the first sacrifice layer 30 includes the second element, which is nitrogen, the same as the cap material layer 28. Furthermore, the ratio of Y to X increases in a direction 40 from the middle surface 38 to the top surface 34. The ratio of Y to X also increases in a direction 42 from the middle surface 38 to the bottom surface 36. That is, the sub layer 301 closer to the second sacrifice 32 and to the cap material layer 28 contains higher nitrogen than oxygen than the sub layer 301 far from the second sacrifice 32 and the cap material layer 28. For example, the ratio of Y to X of the sub layer 301 closest to the middle surface 38 is 1:1. The ratio of Y to X of the sub layer 301 closest to the bottom surface 36 or the top surface 34 is 3:1. The ratio of Y to X of the sub layer 301 sandwiched between the sub layer 301 having the ratio of Y to X equaling 1:1, and the sub layer 301 having the ratio of Y to X equaling 3:1 is 2:1. This special change in the ratio of Y to X can make the upper part and the lower part of the first sacrifice layer 30 has more similar chemical property to the second sacrifice layer 32 and the cap material layer 28, and the chemical mechanical polishing process performed later may proceed more smoothly when encounter the interface between the first sacrifice layer 30 and the cap material layer 28, and the interface between the first sacrifice layer 30 and the second sacrifice layer 32.

According to one preferred embodiment, the steps of forming the first sacrifice layer 30 includes depositing numerous sub layers 301 in different chambers, each sub layer 301 formed in each chamber has different ratio of Y to X, and each chamber has different precursor compositions. Furthermore, each sub layer 301 is homogeneous. In other words, each part in one of the sub layers 301 has the same ratio of Y to X, which means the ratio of Y to X of one of the sub layers 301 is not a gradient. The ratio of Y to X of one of the sub layers 301 is fixed value.

According to another preferred embodiment, the steps of forming the first sacrifice layer 30 include forming numerous sub layers 301, and each sub layer 301 is formed by performing an oxidation process and a nitridation process to a silicon layer alternately.

In an extreme circumstance, the first sacrifice layer 30 may have a chemical formula of $SiO_2$, which means that $X=2$, $Y=0$.

Figure 4:
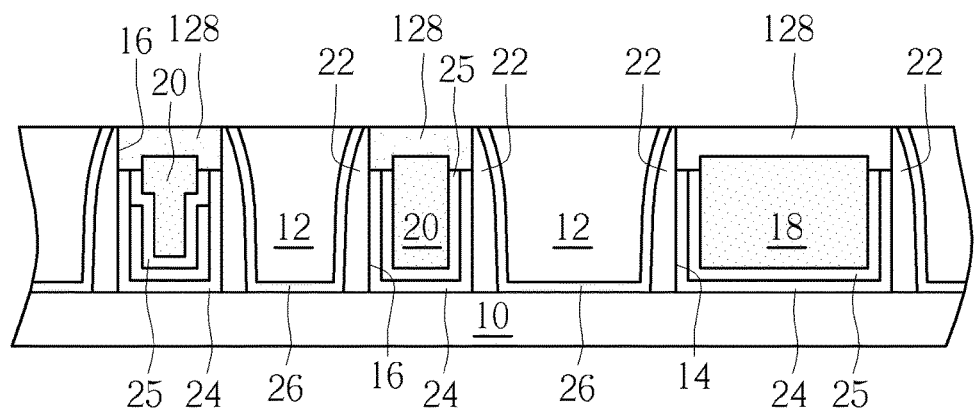

As shown in FIG. 4, a chemical mechanical polishing process is performed to remove the second sacrifice layer 32, the first sacrifice layer 30 and part of the cap material layer 28 by taking the interlayer dielectric 12 as an etching stop layer. After the chemical mechanical polishing process, an over etching process is performed to over etch the cap material layer 28, the interlayer dielectric 12, the spacer 22 and the etching stop layer 26 so as to make sure the dishing phenomenon on the top surface of the interlayer dielectric 12 is removed. In detail, after the chemical mechanical polishing process, the second sacrifice layer 32, the first sacrifice layer 30 and the cap material layer 28 above the interlayer dielectric 12 are removed. The remaining cap material layer 28 in the recesses 14/16 serves as a gate cap layer 128. Moreover, because the first sacrifice layer 30 does not fill in the recesses 14/16 and is above the interlayer dielectric 12, there will not be any silicon oxide in the gate cap layer 128.

The slurry used in the chemical mechanical polishing process has an etching selectivity to silicon nitride over silicon oxide. That is, the silicon nitride is etched faster by the slurry than the silicon oxide. The first sacrifice layer 30 is multiple layers of silicon oxynitride. Moreover, the silicon oxynitride is a mixture of silicon nitride and silicon oxide. The second sacrifice layer 32 and the cap material layer 28 are both made of silicon nitride. Therefore, a removal rate of the first sacrifice layer 30 is different from a removal rate of the second sacrifice layer 32 and a removal rate of the cap material layer 28. In detail, the removal rate of the first sacrifice layer 30 is preferably smaller than the removal rate of the second sacrifice layer 32 and the removal rate of the cap material layer 28 with respective to the same slurry.

Please refer back to FIG. 3A and FIG. 3B, because the width of the recesses 14/16 are different, there is a gap 44 between the highest surface and the lowest surface of the second sacrifice layer 32. The cap material layer 28, the first sacrifice layer 30 and the second sacrifice layer 32 have a profile like teeth. The highest surface and the lowest surface of the second sacrifice layer 32 are at different horizontal level during the chemical mechanical polishing process. If there is not the first sacrifice layer 30, the horizontal level of the top surface of the cap material layer 28 will be influenced by the gap 44 and dishing phenomenon occurs on the top surface of the cap material layer 28 after the chemical mechanical polishing process.

In this invention, by using the different removal rates of the first sacrifice layer 30, the second sacrifice layer 32 and the cap material layer 28 during the chemical mechanical polishing process, the first sacrifice layer 30 can slow down the polishing speed to reduce influence causing by the gaps 44. The highest surface and the lowest surface of the cap material layer 28 can be bring closer during the progressing of the chemical mechanical polishing process. Then, after the chemical mechanical polishing process, the dishing phenomenon on the cap material layer 28 is eliminated, and the dishing phenomenon on the interlayer dielectric 12 is also removed by the chemical mechanical polishing process. As a result, after the chemical mechanical polishing process, the top surface of the gate cap layer 128 and the top surface of the interlayer dielectric 12 are at the same horizontal level, and there is not any dishing phenomenon.

The present invention utilized a first sacrifice layer 30 made of silicon oxynitride to slow down the removal rate of the chemical mechanical polishing process, and the dishing phenomenon on the interlayer dielectric 12 and the gate cap layer 128 can be prevented because of the contribution of the first sacrifice layer 30.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a gate cap layer, comprising:
   providing a substrate with an interlayer dielectric disposed thereon;
   forming a recess in the interlayer dielectric, filling a metal gate in the lower portion of the recess and exposing an upper portion of the recess;
   forming a cap material layer covering the interlayer dielectric and filling in the upper portion of the recess;
   forming a first sacrifice layer covering the cap material layer, wherein the first sacrifice layer has a composition different from a composition of the cap material layer;
   forming a second sacrifice layer covering the first sacrifice layer, wherein the second sacrifice layer has a composition the same as the composition of the cap material layer;
   removing the second sacrifice layer, the first sacrifice layer and the cap material layer above a top surface of the interlayer dielectric by a chemical mechanical polishing process and using a slurry; and
   after the chemical mechanical polishing process, the cap material layer remaining in the upper portion of the recess becoming a gate cap layer.

2. The method of fabricating a gate cap layer of claim 1, wherein the first sacrifice layer comprises a plurality of sub layers, each of the sub layers comprises a first element and a second element, and the ratio of the second element to the first element in each of the sub layers is variable.

3. The method of fabricating a gate cap layer of claim 1, wherein besides silicon, the first sacrifice layer comprises a first element the same as the interlayer dielectric comprises.

4. The method of fabricating a gate cap layer of claim 3, wherein besides silicon, the first sacrifice layer comprises a second element the same as the cap material layer comprises.

5. The method of fabricating a gate cap layer of claim 4, wherein the first sacrifice layer has a top surface contacting the second sacrifice layer and has a bottom surface contacting the cap material layer, a middle surface of the first sacrifice layer is defined between the top surface and the bottom surface.

6. The method of fabricating a gate cap layer of claim 5, wherein a ratio of the second element to the first element increases in a direction from the middle surface to the top surface, and increases in a direction from the middle surface to the lower surface.

7. The method of fabricating a gate cap layer of claim 4, wherein the first element is oxygen and the second element is nitrogen.

8. The method of fabricating a gate cap layer of claim 4, wherein the first sacrifice layer has a chemical formula of $SiO_xN_y$, and $0<X\leq2$, $0\leq Y<4/3$.

9. The method of fabricating a gate cap layer of claim 8, wherein the steps of forming the first sacrifice layer comprises depositing a plurality of sub layers in different chambers, each sub layer formed in each chamber has different ratio of Y to X, and each chamber has different precursor compositions.

10. The method of fabricating a gate cap layer of claim 8, wherein the steps of forming the first sacrifice layer comprises forming a plurality of sub layers, and each sub layer is formed by performing an oxidation process and a nitridation process to a silicon layer alternately.

11. The method of fabricating a gate cap layer of claim 1, wherein the first sacrifice layer has a chemical formula of $SiO_xN_y$, and $X=2$, $Y=0$.

12. The method of fabricating a gate cap layer of claim 1, wherein a removal rate of the first sacrifice layer is smaller than a removal rate of the second sacrifice layer with respective to the same slurry.

13. The method of fabricating a gate cap layer of claim 1, wherein the first sacrifice layer does not fill into the recess.

* * * * *